United States Patent
Machavariani et al.

(10) Patent No.: US 10,916,404 B2
(45) Date of Patent: Feb. 9, 2021

(54) TEM-BASED METROLOGY METHOD AND SYSTEM

(71) Applicant: NOVA MEASURING INSTRUMENTS LTD., Rehovot (IL)

(72) Inventors: Vladimir Machavariani, Rishon-Lezion (IL); Michael Shifrin, Ashqelon (IL); Daniel Kandel, Ramat Gan (IL); Victor Kucherov, Ashdod (IL); Igor Ziselman, Modi'in-Maccabim-Re'ut (IL); Ronen Urenski, Bat Yam (IL); Matthew Sendelbach, Fishkill, NY (US)

(73) Assignee: NOVA MEASURING INSTRUMENTS LTD., Rehovot (IL)

( * ) Notice: Subject to any disclaimer, the term of this patent is extended or adjusted under 35 U.S.C. 154(b) by 0 days.

(21) Appl. No.: 16/488,974

(22) PCT Filed: Feb. 27, 2018

(86) PCT No.: PCT/IL2018/050220
§ 371 (c)(1),
(2) Date: Aug. 27, 2019

(87) PCT Pub. No.: WO2018/154587
PCT Pub. Date: Aug. 30, 2018

(65) Prior Publication Data
US 2019/0393016 A1    Dec. 26, 2019

Related U.S. Application Data

(60) Provisional application No. 62/563,113, filed on Sep. 26, 2017, provisional application No. 62/463,771, filed on Feb. 27, 2017.

(51) Int. Cl.
*H01J 37/26* (2006.01)
*G06T 7/00* (2017.01)
(Continued)

(52) U.S. Cl.
CPC ............ *H01J 37/26* (2013.01); *G06T 7/0006* (2013.01); *G06T 7/0008* (2013.01); *G06T 7/60* (2013.01);
(Continued)

(58) Field of Classification Search
USPC ........................................................ 250/311
See application file for complete search history.

(56) References Cited

U.S. PATENT DOCUMENTS

2009/0144691 A1* 6/2009 Rathsack et al. ....... G06F 17/50
716/19
2019/0064110 A1* 2/2019 Timp et al. .......... G01N 27/447

* cited by examiner

*Primary Examiner* — Kiet T Nguyen
(74) *Attorney, Agent, or Firm* — Alphapatent Associates, Ltd; Daniel J. Swirsky

(57) ABSTRACT

A control system is presented for use in measuring one or more parameters of a three-dimensional patterned structure. The control system is configured as a computer system comprising a data processor configured to receive and process raw measured TEM image data, $TEM_{meas}$, and generate output data indicative of one or more parameters of a patterned structure. The data processor comprises an optimization module configured and operable to utilize data indicative of one or more parameters of TEM measurement mode and perform a fitting procedure between the raw measured TEM image data, $TEM_{meas}$, and a predetermined simulated TEM image data, $TEM_{simul}$ based on a parametrized three-dimensional model of features of the patterned structure, and generate simulated image data corresponding to a best fit condition, to thereby enable determination therefrom of the one or more parameters of the structure.

14 Claims, 4 Drawing Sheets

(51) Int. Cl.
*G06T 7/60* (2017.01)
*H01J 37/22* (2006.01)
(52) U.S. Cl.
CPC .. *H01J 37/222* (2013.01); *G06T 2207/10061* (2013.01); *G06T 2207/20076* (2013.01); *H01J 2237/221* (2013.01); *H01J 2237/24592* (2013.01)

TEM-BASED METROLOGY METHOD AND SYSTEM

CROSS-REFERENCE TO RELATED APPLICATIONS

This application is a U.S. National Phase Application under 35 U.S.C. 371 of International Application No. PCT/IL2018/050220, which has an international filing date of Feb. 27, 2018, and which claims the benefit of priority from U.S. Provisional Patent Application No. 62/463,771, filed Feb. 27, 2017, and U.S. Provisional Patent Application No. 62/563,113, filed Sep. 26, 2017, the disclosures of which are incorporated herein by reference in their entirety.

TECHNOLOGICAL FIELD AND BACKGROUND

The present invention is generally in the field of metrology techniques for measuring various parameters of patterned structures, such as semiconductor wafers, and can be used for example for controlling one or more processes in the manufacture of such structures.

Semiconductor structures, such as integrated circuits, become more complicated in the dimensions and shapes of pattern features, as well as integrate thinner and multi-stack films of novel material compositions (e.g. SiGe, HKMG, 3D FinFet, etc.). Accordingly, there exists an increasing need in providing accurate measurements of full 3-dimensional structures, and in enabling these measurements to be applied to structures progressing on a production line, i.e. automatic inspection (metrology, defect detection, process control, etc.) of patterned structures.

Various metrology/inspection techniques have been developed. Some of them utilize model-based interpretation of measured data to extract parameters of the structure being measured. The increasing complexity in patterns and material compositions of patterned structures require more complex models for interpretation of measured data. To this end, model optimization techniques have been developed utilizing, for example, a hybrid approach and/or measured data from reference system(s).

Hybrid Metrology is the practice of combining two or more metrology tools that measure the same or similar structures. Data is shared between toolsets in complementary way to enhance metrology performance, and enables measurement of complex structures that cannot be measured with enough performance by any of the individual toolset. Various examples of a hybrid approach are described in WO 11/158239, WO 14/102792 WO 15/125127, WO 17/021968, all assigned to the assignee of the present application.

As indicated above, interpretation of measured data may be assisted by comparison—or model optimization by structure parameter(s) measured by a reference system. One of the commonly used, high-accuracy, reference measurement system is based on Transmission Electron Microscopy (TEM). TEM is known to allow imaging of extremely small features, on the order of nanometers. With the decrease of pattern features in semiconductor devices, TEM is widely used for monitoring the manufacturing process. In contrast to SEM, which only images the surface of a material, TEM allows also to analyze the internal structure of a sample. In a TEM, a broad beam impacts the sample and electrons that are transmitted through the sample are focused to form an image of the sample. In a scanning transmission electron microscope (STEM), a primary electron beam is focused to a fine spot, and the spot is scanned across the sample surface. Electrons that are transmitted through the substrate are collected by an electron detector on the far side of the sample, and the intensity of each point on the image corresponds to the number of electrons collected as the primary beam impacts a corresponding point on the surface.

GENERAL DESCRIPTION

There is a need in the art for a novel metrology technique of 3D patterned structures (e.g. a periodical semiconductor device array, e.g. logic, memory) utilizing image data obtained by a Transmission Electron Microscopy (TEM) or Scanning Transmission Electron Microscopy (STEM). The measurement results may be used for automatic process control (APC), e.g. during semiconductor manufacturing.

TEM/STEM is a microscopy technique in which a beam of electrons is transmitted through a very thin section or slice (also termed "Lamellae") of a structure, and interaction of the electrons with features of the structure within the Lamellae, forms an image of said Lamellae. TEM is known to provide high-accuracy measurements which are required for measuring in complex patterned structures (complex patterns and material compositions).

TEM-based measurements are relatively slow (as compared to optical ones), and are typically performed at a stand-alone station, which may be part of a FAB production line. According to the conventional approach, TEM images are 2D images, which are processed to find distances and angles between edges in TEM images, utilizing image processing algorithms based on pattern recognition and pre-defined recipes. Thus, the known methods of data analysis of TEM images provide some mixed information about the Patterned Structure features within Lamellae being imaged, and practically cannot provide full geometrical (dimensional) and/or material information about a 3D structure within the Lamellae image. These methods are neither robust nor accurate in the case of a 3D structure (e.g. transistor device).

The present invention, according to one of its aspects, provides a novel system and method for automatic robust and accurate retrieval of geometric and/or material-related parameters of 3D structures from one or several TEM images. In this connection, it should be noted that the principles of the invention can be applied to TEM data obtained with or without scan-mode measurements. Therefore the term "TEM" used herein below should be interpreted broadly covering also STEM tool/measurements.

The technique of the invention provides novel model-based interpretation of image data obtained by TEM, to provide full geometrical (and possible also material) interpretation of the TEM data. It should be understood that TEM image data is not a "real image" or "picture", but pixel map data, which is an intensity map based on detected transmission of electrons through the structure, defined by the physics of TEM imaging, namely such parameters as electron beam energy, type and configuration of the detector, and geometry and material composition of the structure.

The invention utilizes position data of a measurement slice (Lamellae) with respect to a structure under measurements, considering a parametrized 3D model of features (e.g. dimensional parameters) of the structure, and possibly also material compositions' properties of the structure.

As described above, according to the conventional approach, 2D TEM images are processed to find distances and angles between edges in the TEM images, utilizing image processing algorithms based on pattern recognition and pre-defined recipes. The present invention is based on the inventor's understanding that appearance of the edges-related and other features in a TEM image is strongly connected to the exact Lamellae position and thickness relative to the structure. This, as well as other factors, such as low contrast appearance of some features in a TEM image, prevents the conventional approach from being sufficiently robust.

More specifically, as will be described further below, the invention utilizes an accurate 3D model-based matching (fitting) procedure which takes into account position uncertainty and has superior robustness if some of the features have low contrast. Taking into account physical constraints (from knowledge of semiconductor manufacturing process and trends), the physical stability of obtained results is assured and robustness of the analysis is improved.

Based on the 3D model of a structure (3D geometry and material properties) and the physics of the specific TEM (or STEM) measurement mode, and possibly also a detection scheme, a simulated (expected/modeled) TEM image data is determined/calculated. The detection scheme, for example, may be Bright Field (BF), Dark Field (DF), Annular Dark Field (ADF), High Angle Annular Dark Field (HAADF), Energy Loss (EL), and others.

It should be noted that, for the purposes of the present disclosure, data indicative of TEM transmission mode includes Lamellae position data with respect to the structure. The theoretical TEM image data is indicative of a 2D array of intensities, where different positions in the array correspond to different positions within the Lamellae projection.

The 3D model (geometry and material properties) of the structure (for example, transistors) may be provided using any known suitable technique, for example obtained by OCD measurements and created based on experience and knowledge of semiconductor manufacturing, e.g. NovaMARS® software (application development platform) commercially available from Nova Measuring Instruments, Israel. Such 3D model of a structure includes parametrization, which allows to describe process variation in the manufacturing process. It should be understood that selected 3D model is to be sufficient to describe the normal and common abnormal process variations, and, on the other side, a number of adjustable (floating) parameters in the model is to be as small as possible.

According to another aspect of the invention, it provides a novel hybrid approach, according to which TEM data is used for optimizing modeling of or measurements by a type different from TEM (e.g. OCD), or vice versa, resulting in enhanced performance of either one or both of the TEM and different type metrology measurements that cannot be obtained separately.

Thus, according to one broad aspect of the invention, there is provided a control system for use in measuring one or more parameters of a three-dimensional patterned structure. The control system is configured as a computer system comprising a data processor configured to receive and process raw measured TEM image data, $TEM_{meas}$, and generate output data indicative of one or more parameters of a patterned structure. The data processor comprises an optimization module configured and operable to utilize data indicative of one or more parameters of TEM measurement mode and perform a fitting procedure between the raw measured TEM image data, $TEM_{meas}$, and a predetermined simulated TEM image data, $TEM_{simul}$ based on a parametrized three-dimensional model of features of the patterned structure, and generate simulated image data corresponding to a best fit condition to thereby enable determination therefrom of the one or more parameters of the structure.

The parameter(s) of the structure to be determined may include dimensional parameters, such as for example one or more of the following: Critical Dimensions (CD) of the pattern features, layer(s)' thickness(es), Side Wall Angle (SWA), etc.; as well as materials related parameters/properties.

The parametrized 3D model of the structure's features includes geometrical features (dimensions of the features) of the structure, and in some embodiments, may also include material-related data (material properties).

The optimization module may be configured and operable to perform the fitting procedure while varying one or more of the following: one or more of the three-dimensional model parameters; one or more of material properties; and Lamellae position with respect to the three-dimensional model of the structure.

In some embodiments, the control system may be configured to access a storage device and receive therefrom the predetermined simulated TEM image data, $TEM_{simul}$. Alternatively or additionally, the data processor further comprises a data simulator module, which is configured and operable to analyze data indicative of the parametrized three-dimensional model of geometrical features of the patterned structure, and create the predetermined simulated TEM image data, $TEM_{simul}$. The simulated TEM image data may include plurality of simulated TEM images for multiple different Lamellae position and geometry with respect to the three-dimensional model of the patterned structure.

The control system may be configured for data communication with one or more measured data providers to receive therefrom the raw measured TEM image data, $TEM_{meas}$, comprising data indicative of at least one TEM image.

The data indicative of the three-dimensional model of the patterned structure may further comprises material related data of the structure.

The data indicative of the one or more parameters of the TEM measurement mode comprises Lamellae geometry data. The latter may include one or more of the following: Lamellae thickness, Lamellae orientation, Lamellae position with respect to the structure.

The data indicative of the one or more parameters of the TEM measurement mode may further comprise data about a detection scheme corresponding to the measured TEM image data.

The control system may further comprise a parameter calculator module configured and operable to provide, from the simulated TEM image data corresponding to the best fit condition, the one or more parameters of the patterned structure being measured. The parameter calculator module may be configured and operable to provide, from the simulated TEM image data corresponding to the best fit condition, full geometrical interpretation of the TEM image data.

The control system may further comprise an analyzer configured to use the one or more parameters of the patterned structure determined from the TEM image data to optimize measured data corresponding to measurements of a type different from TEM, obtained on the patterned structure. The analyzer may comprise a modelling utility configured and operable to use the one or more parameters of the patterned structure determined from the TEM image data and optimize measured data interpretation model for said measurements of the type different from TEM. Such different type measured data may include OCD measured data and/or XRS data and/or XRF data.

The invention according to its another broad aspect provides a metrology method for use in determining one or more parameters of a three-dimensional patterned structure, the method comprising: providing simulated TEM image data comprising data indicative of at least one simulated TEM image of a structure similar to the patterned structure under measurements; and performing a fitting procedure between measured TEM image data of the patterned structure and said simulated TEM image data, and determining measured Lamellae position of said at least one measured TEM image from a best fit condition between the measured and simulated data; and generating output data indicative of simulated TEM image data corresponding to a best fit condition to thereby enable determination therefrom of the one or more parameters of the structure.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 2A to 2C schematically illustrate the principles of the invention for generating simulated TEM image data, wherein FIG. 2A shows a "TEM stack" as a multi-parameter function of structure geometry and material related data, and Lamellae geometry; and FIGS. 2B and 2C exemplify a 3D patterned structure undergoing TEM imaging and parameters describing Lamellae geometry;

DETAILED DESCRIPTION OF EMBODIMENTS

Figure 1:
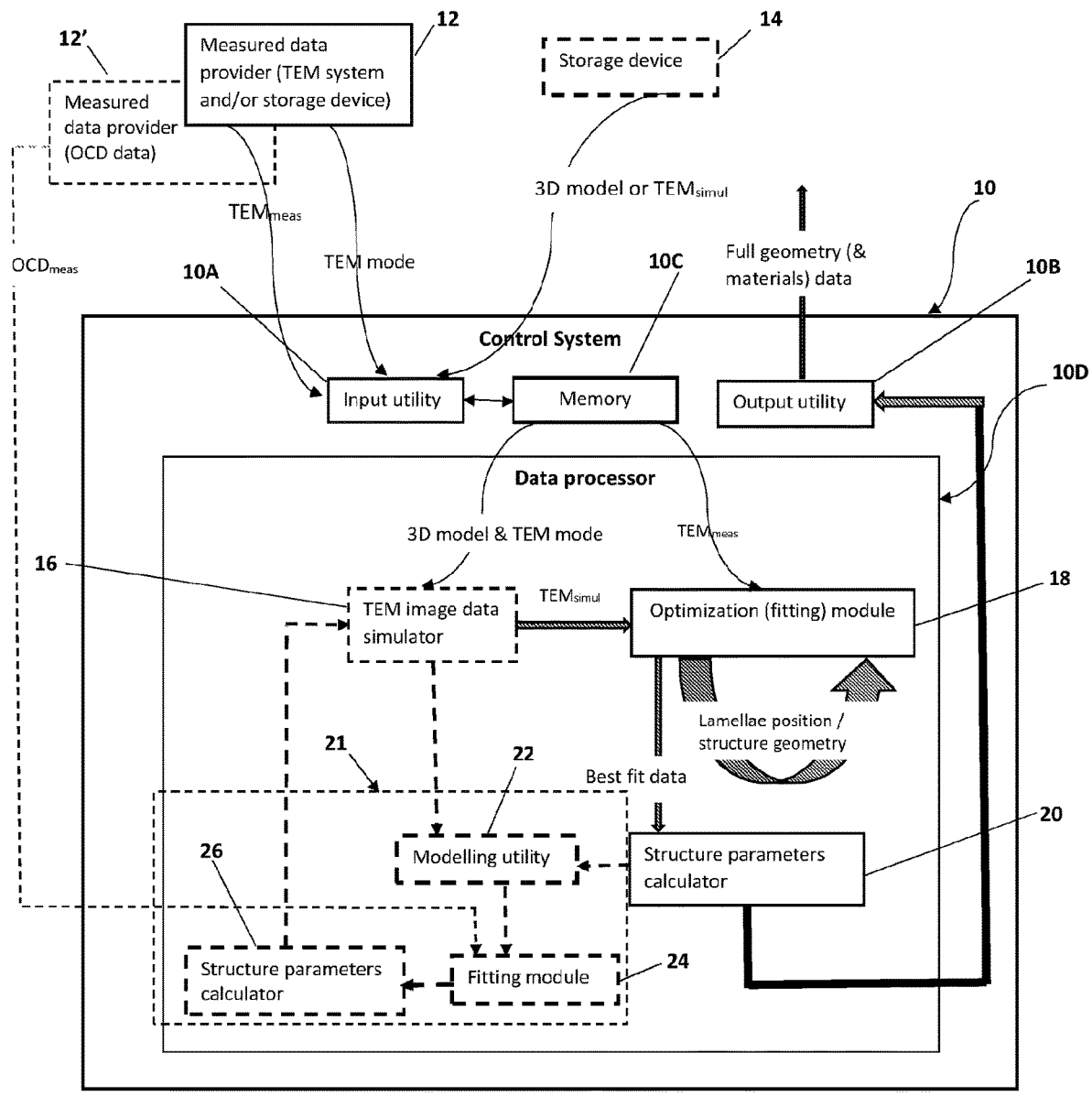
FIG. 1 is a block diagram of a control system of the invention for determining various structure parameters from TEM image data.

Reference is made to FIG. 1 illustrating, by way of a block diagram, a control system 10 according to the present invention. The control system 10 is configured and operable for analyzing measured data comprising TEM image data, and determining a full geometrical (and possibly also material composition) information about a structure being measured. To this end, as shown in the figure, the control system 10 is associated with a measured data provider 12. The measured data provider may be a TEM measurement system or an external storage, where the measured data is stored and to which the control system 10 is connectable (e.g. via wireless signal communication using a communication network). It should be understood that configuration and operation of the TEM measurement system providing the TEM image data are known per se and do not form part of the present invention, and therefore need not be specifically described here. It should also be noted that the analysis of the TEM measured data by the control system 10 may be at least partially performed off-line.

The control system 10 is configured as a computer system having, inter alia, such main structural and functional utilities (hardware and/or software utilities) as data input and output utilities 10A, 10B, memory 10C, and data processor 10D. The data processor 10D is configured (i.e. preprogrammed) for processing and analyzing measured data comprising measured TEM image data, $TEM_{meas}$, and determining the structure parameter(s).

Thus, the control unit 10 is configured to receive from the measured data provider 12 input data indicative of measured TEM image data, $TEM_{meas}$. The measured TEM image data is raw TEM data, and may include a single or set of several TEM or STEM images. As indicated above, TEM image is actually pixel map data, or intensity map data (2D array of intensities) based on transmission of electrons through a portion of the structure being measured/imaged (Lamellae) as detected by a pixel matrix of a detector. Different positions (pixels) in the array correspond to different positions on the Lamellae projection, as will be described more specifically further below.

Further, as shown in the figure, the control system 10 may be configured to receive from a storage device 14 input data comprising model data indicative of at least one parametrized three-dimensional model of a geometrical features of a structure similar to the patterned structure under measurements. Alternatively, or additionally, although not specifically shown, the control system 10 may include a suitable 3D model creator utility/module to provide such 3D model data. The 3D model data may be processed/used by the system 10 to create data indicative of a simulated TEM image data, $TEM_{simul}$. As also shown in the figure, alternatively, the control system 10 may be configured to access and receive from the storage device (a library) data indicative of the simulated TEM image data, $TEM_{simul}$.

As indicated above, the 3D model data includes a geometrical model of the structure, and may also include material-related model data. Preferably, the 3D model includes both the 3D geometry and material compositions/properties. The 3D model of the structure is built by taking into account the physical constraints (from knowledge of semiconductor manufacturing process and trends), and includes parametrization, which allows to describe process variation in the manufacturing process.

In this connection, it should be noted that techniques of 3D modeling of a patterned structure are known, and do not form part of the present invention. An example of such modeling technique is NovaMARS® product commercially available from Nova Measuring Instruments. Such model is, for example, used for interpretation of Optical Critical Dimension (OCD) measurements.

Also utilized by the control unit 10 is input data comprising information about a TEM mode used to obtain the measured TEM image data. Such TEM mode data could include data indicative of at least one of a measurement mode/scheme, including for example Lamellae related data (position data, angular position, dimension, etc.), measurement condition data (applied metrology technique parameters effecting signal absorption, e.g. dark/bright field, angle, scale (magnification), etc.). Also, such data may include the measured structure related data (e.g. geometry and/or materials, etc.).

More specifically, the Lamellae position data may include an approximate position of the Lamellae center relative to the measured structure, angular orientation, Lamellae thickness. According to another embodiment of the invention, the position of the Lamellae center is not required and is determined automatically during the Rough Positioning step of data analysis. This will be described more specifically further below.

The data processor 10D receives the input data (via the memory 10C) including 3D model data about the structure, TEM mode data, and measured TEM image data. The data processor 10D includes an optimization utility (including a fitting module 18) and parameters' calculator 20.

In some embodiments, the data processor 10D also includes a TEM image data simulator 16. The TEM image simulator 16 is configured and operable to receive the TEM mode data and 3D model data and generate simulated 2D TEM image data, $TEM_{simul}$, using the 3D model of the structure and taking into account the TEM imaging parameters/conditions (TEM mode). The simulated 2D TEM image data is thus generated (i.e. by transformation of 2D TEM image onto a 3D model of the structure), which takes into account Lamellae position uncertainty. This will be described more specifically further below.

The optimization/fitting module 18 receives the measured TEM image data, $TEM_{meas}$, and receives, from the simulator module 16 or from the library, the simulated TEM image(s) $TEM_{simul}$, and performs a fitting procedure.

The fitting procedure is an iterative procedure of comparing between the simulated image data $TEM_{simul}$ and measured data $TEM_{meas}$, while varying the floating parameters of the simulated data (e.g. structure parameters, Lamellae geometry and position data), until a best fit condition is achieved. In other words, registration between the simulated and measured images is performed to match the relative position, and a matching score (merit function or target function) is calculated until the minimal value thereof is obtained, which corresponds to the best fit condition of the simulated data. The best fit condition data for the simulated image data $TEM_{simul}$ actually describes/corresponds to the specific Lamellae image/projection in the structure being measured. This best-fit simulated TEM image data is then used by the parameters' calculator module 20 to determine one or more parameters of the structure within the Lamellae portion.

It should be understood that multiple simulated TEM images can be created for various "theoretical" Lamellae conditions (positions, dimensions, etc.) and TEM modes, for the same 3D modeled structure, to form a library of simulated TEM image data. Generally speaking, the simulator module 16, if any, may be an external utility to which the fitting module 18 has access to receive the simulated data. The fitting procedure between measured and simulated data may be repeated for various Lamellae positions (during TEM scan) to enable the full geometrical interpretation of the TEM image data, or a so-called "TEM stack" data.

The structural parameter(s) may be output, via output utility 10B, to a further analyzer (not shown) to be analyzed using any known suitable technique to evaluate the respective parameters/conditions of a structure manufacturing process to modify/adjust the process parameters.

Alternatively, or additionally, as shown in FIG. 1 by dashed lines (as being an optional procedure), the so-obtained parameters of the structure may be input into an analyzer 21, which is configured and operable for measured data analysis of measurements of a different type (i.e. based on different physical principles, e.g. spectrometry measurements). It should be noted that such analyzer 21 may be configured to perform model-based or model-less data analysis. In the present not limiting example, a model-based configuration of the analyzer 21 is shown.

The analyzer 21 includes a modeling utility 22 for optimizing data interpretation model(s). This may be data interpretation model for another metrology technique, e.g. OCD technique. In this case, the control system 10 (the data processor 10D) may include a fitting module 24 receives measured OCD data, $OCD_{meas}$, from the same measured data provider 12 or a separate data provider 12', and utilizes the optimized OCD data interpretation model to perform a fitting procedure until a best fit condition is achieved, which data is then used by a calculator module 26 to determine one or more structure parameters from the OCD measurements.

Figure 2A:
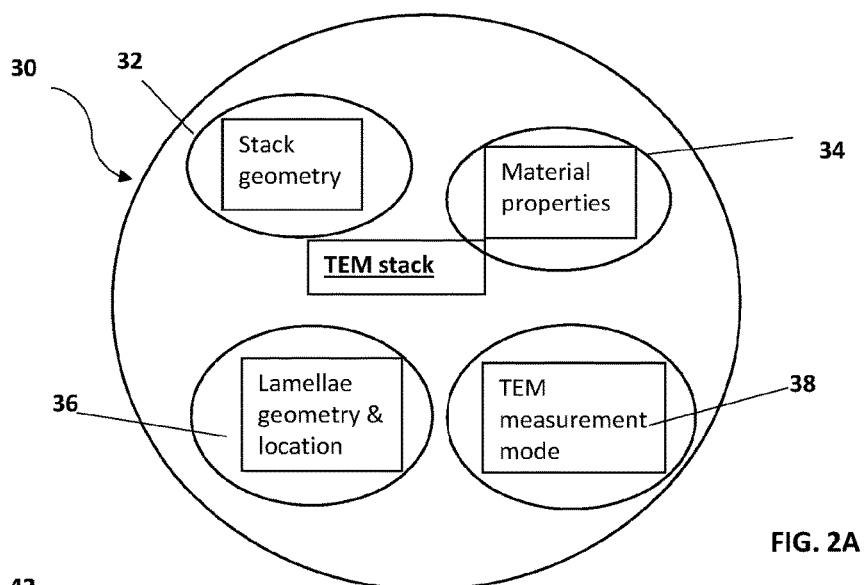
Figure 2B:
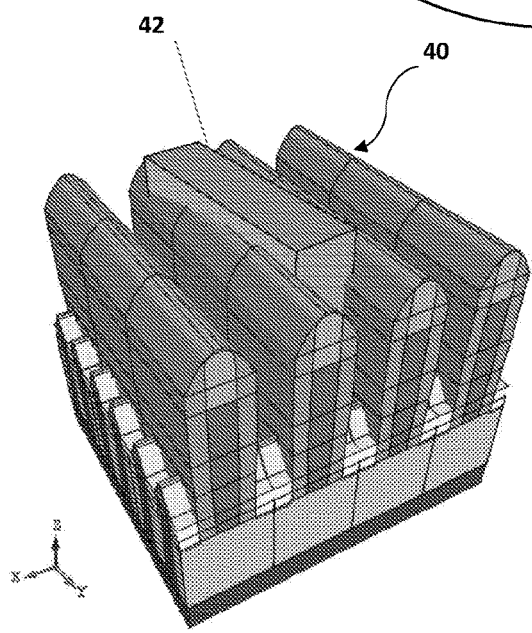
Figure 2C:
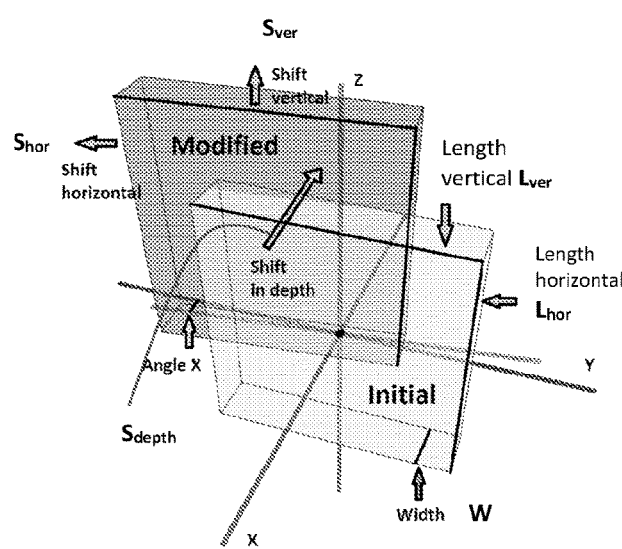

Reference is now made to FIGS. 2A, 2B and 2C schematically illustrating the principles of operation of the TEM image simulator module 16. As indicated above, the TEM image simulator module 16 generates data indicative of 2D simulated/expected TEM image, which takes into account Lamellae position uncertainty. More specifically, the expected 2D TEM image is simulated (calculated) from the 3D model of the structure and the physics of the specific TEM/STEM measurement mode, using an appropriate modeling software application.

As illustrated in FIG. 2A, the TEM image data simulation is based on the understanding that TEM image 30 (so-called "TEM stack" considering a multi-layer patterned structure, which is typically the case in semiconductor industry) is a multi-parameter function of such factors/data as the structure (stack) geometry 32, material related data of the structure 34, Lamellae geometry and relative location in the structure 36, and TEM measurement mode data 38. The stack geometry data 32 includes the geometrical parameters in the 3D model format and/or number of repeated stack periods (along one or two axis across the structure/stack). The material related data 34 is indicative of material properties collection (parameters), and includes material (type, name, etc.) and/or absorption value (or range of values).

FIG. 2B exemplifies a 3D patterned structure (stack) 40, undergoing TEM imaging with a certain geometry/position of Lamellae 42 with respect to the structure 40. The parameter(s) of the patterned structure to be determined may include dimensional parameters, such as for example one or more of the following: Critical Dimensions (CD) of the pattern features, layer(s)' thickness(es), Side Wall Angle (SWA), etc.; as well as materials related parameters/properties.

As shown in FIG. 2C, the Lamellae geometry/position data 36 includes one or more of the following parameters: horizontal length $L_{hor}$, vertical length $L_{ver}$, width (thickness) as well as a width step for calculation, angular position around z-axis (with the initial position perpendicular to the x-axis (angle X=0), horizontal shift $S_{hor}$, vertical shift $S_{ver}$, and in depth shift $S_{depth}$.

Figure 3:
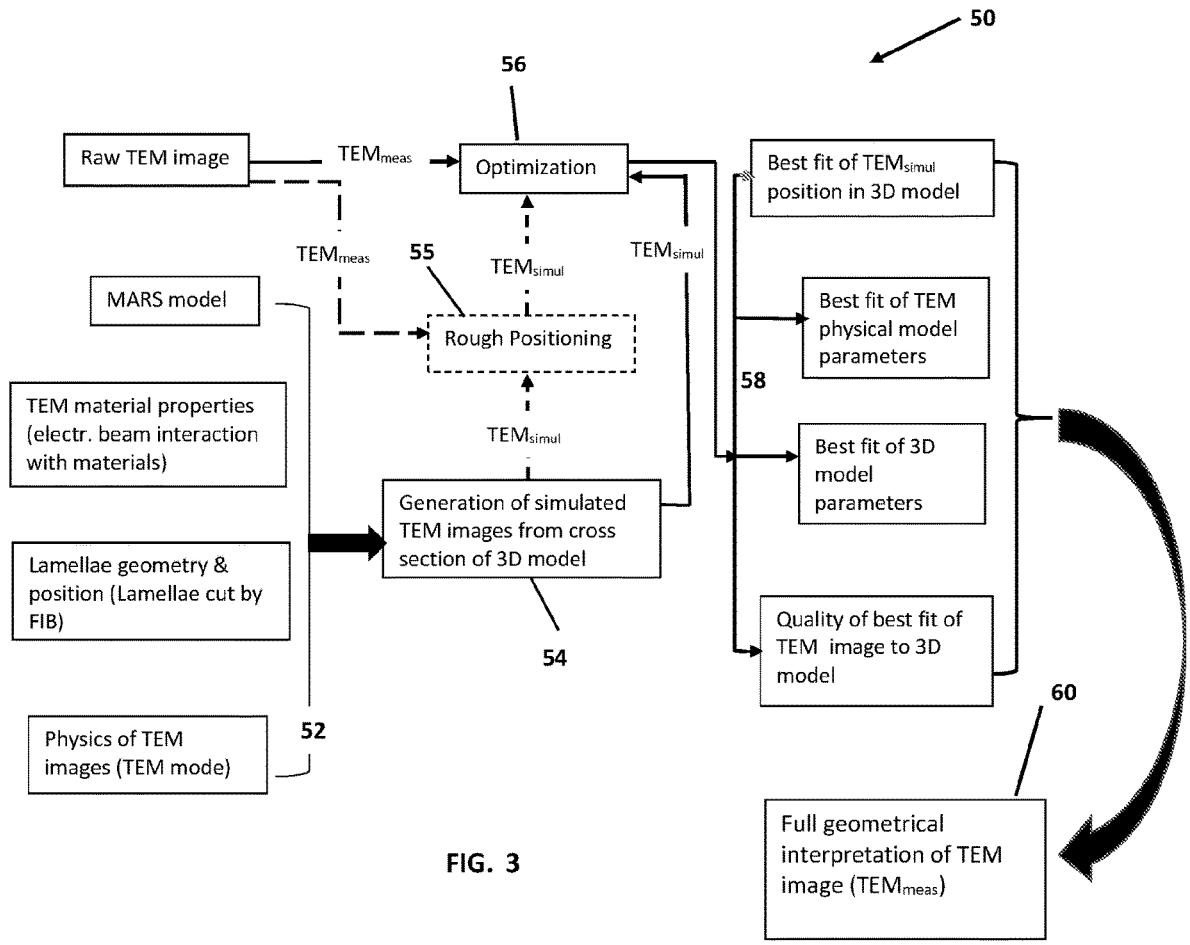
FIG. 3 is a flow diagram of an exemplary method of the present invention for obtaining full geometrical interpretation of TEM measurements from raw TEM image data.

Referring to FIG. 3, there is illustrated a flow diagram 50 of an exemplary method of the present invention, e.g. carried out by the above described system 10, for obtaining full geometrical interpretation of TEM measurements from raw TEM image data indicative of one or more TEM images. As shown in the figure in a self-explanatory manner, input data is provided (step 52) in a manner described above, i.e. from measured data provider(s) including a measurement system and/or separate storage device. The input data includes: raw TEM image data, $T_{meas}$, 3D model data of a patterned structure, $TEM_{mode}$ data (physics of TEM images, as described above), and TEM material properties related data (including data indicative of electron beam interaction with the materials). In the present non-limiting example, the 3D model data is the NovaMARS model.

The 3D Model(s) of the structure and data about various conditions of the TEM imaging mode are processed to generate 2D simulated TEM image(s) or TEM signatures, $TEM_{simul}$ (step 54). In this connection, it should be noted, that the present non-limiting example illustrates Real Time Regression (RTR) approach, according to which simulated date is generated in an "on-line" mode. As described above, a library (database of simulated data) for simulated TEM image(s) can be prepared, based on the 3D model, in an off-line mode, and used later on (e.g. in the on-line mode) for the optimization, i.e. fitting with measured data. In yet another example, in addition to real-time and libraries based techniques, a combined approach may be used. For example, some "sparse" library may be created and after fitting with such library, further fitting is done based on the RTR approach.

The simulated TEM signature(s) then undergo an "optimization" procedure (step 56). In this connection, as shown in the figure in dashed lines, prior to the optimization step 56, an optional rough positioning step 55 may be performed, i.e. preliminary TEM (or STEM) image analysis.

Figure 4:
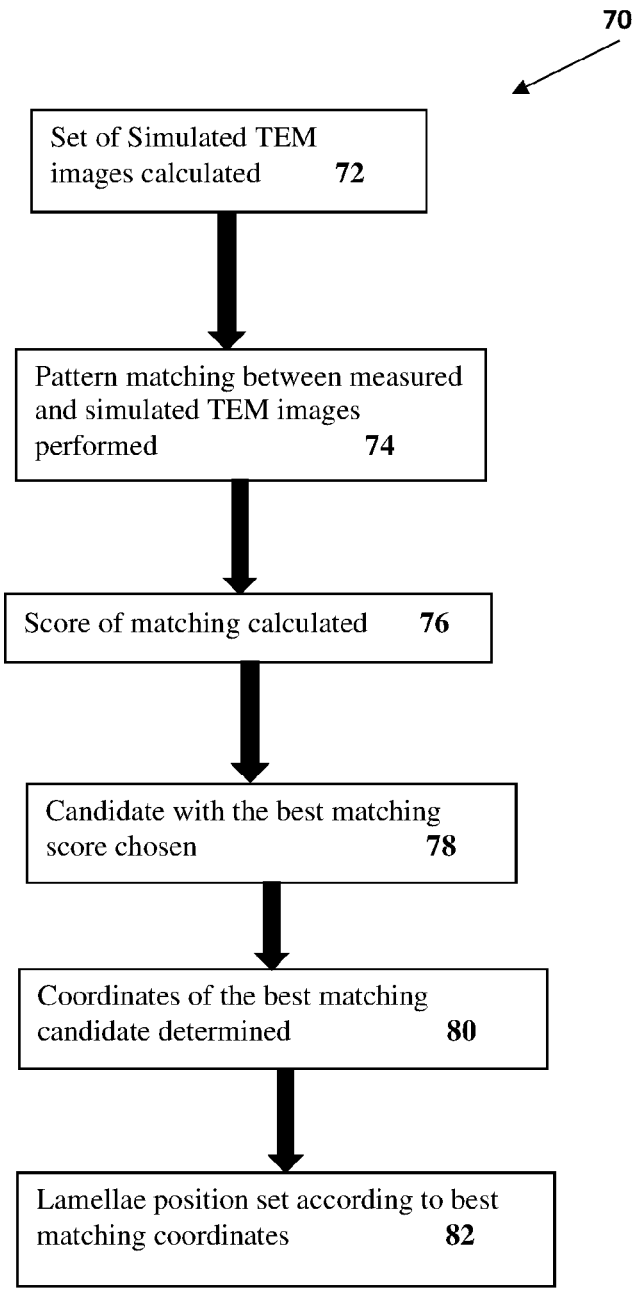
FIG. 4 is a flow diagram exemplifying an optional step of the method of FIG. 3 preliminary TEM image analysis (rough positioning).

As exemplified by a flow diagram 70 in FIG. 4, such rough positioning may be performed as follows. A set of simulated TEM images is calculated (step 72). More specifically, a fitting procedure is performed (Lamellae position adjustment, as shown in FIG. 2C). If it appears that Lamellae orientation is not matched to periodicity axes ("non-zero angle" later on, which means that the angle between Lamellae and x-axis is different from 0, 90, 180 or 270 degrees), then such set may include a single wide image or a set of wide images with different shifts in direction perpendicular to the Lamellae surface. The "wide" simulated image means that the width of the simulated image is significantly larger (several times) than the width of the measured TEM image. For "non-zero" angle the periodicity of the device pattern is broken by the Lamellae cut orientation, so different parts of wide image (in horizontal direction) may correspond to different sections of the structure. If Lamellae orientation is matched to the periodicity axes ("zero angle" later on, which means that the angle between Lamellae and x-axis is either of 0, 90, 180 or 270 degrees), it is a set of images with different shifts in direction perpendicular to the Lamellae surface. In the case of "zero angle", there is no point in creating too wide images because of periodicity of the structure pattern, so the optimal width of simulated TEM image has to cover the periodicity in corresponding direction plus margins for more robust pattern matching. Typical margin in horizontal direction is a half width of the measured TEM image width from each side, so an optimal width of the simulated image for "zero angle" is the periodicity in horizontal direction plus the width of measured TEM image.

Then, pattern matching between measured and simulated TEM images is performed (step 74). To this end, for each simulated TEM image from the set found in step 72, the best matching candidate is determined. A score of matching (merit function) is then calculated (step 76), e.g. using the Normalized Cross-Correlation technique, and a candidate with the best matching score (minimal value of the merit function) is chosen (step 78). Coordinates of the best matching candidate are determined (step 80) and the Lamellae position is set accordingly (step 82).

Turning back to FIG. 3, the optimization procedure (step 56) between the simulated TEM image and measured TEM image (raw data) is performed, either using the above-described preceding rough positioning step 55 or not. The optimization is actually a fitting procedure aimed at obtaining optimized registration (best fit condition) of the simulated and measured images $TEM_{simul}$ and $TEM_{meas}$. The fitting procedure includes a number of iterations while varying 3D model parameters (geometrical parameters) and/or TEM mode parameters/conditions (e.g. material properties and/or Lamellae position with respect to the 3D modeled structure) until the best fit condition is achieved (step 58) for the following: the simulated TEM image position in the 3D model, the TEM physical model parameters (TEM stack); 3D model parameters; and the required quality of the best fit between the TEM image and the 3D model. The resulting simulated TEM image data, corresponding to the best fit condition is used to determine therefrom one or more of the structure parameters. Actually, this technique, when repeated for various TEM images (Lamellae positions) provides for obtaining the full geometrical and possibly also material interpretation of the TEM image(s).

As described above, the registration (fitting) between the simulated and measured images is performed to match the relative position, shape and contrast, and a matching score (merit function) is calculated while performing iterations to minimize the value of the merit function. Different merit functions (matching score schemes) can be used to define the best fit condition. For example, Average Deviation procedure compares intensities per pixel between the measured and simulated images. Another metrics may tolerate intensity gain and offset variations which may originate from electronic instabilities. Based on calculated target function/merit function values, the regression is performed on geometrical parameters and/or material properties and/or lamellae position and parameters, in order to find the best match between a set of measured images and the corresponding predictions (simulation).

It should be noted that the above technique of the invention also provides for TEM recipe optimization. This can be carried out as follows: First, Lamella characteristics (thickness, position, orientation, etc.) are defined for optimal information content based on the 3D model and simulated TEM images. TEM measurement conditions (measurement mode, beam energy, detector type,) are defined for optimal information content based on the 3D model and simulated TEM images. This allows for facilitating interpretation of 3D TEM and 3D SEM images using the 3D model to optimize measurement conditions (e.g. number of required TEM images). These procedures can be used for matching TEM image contours/edges to simulated edges from the 3D model without physical TEM image model.

Thus, the present invention provides for interpretation of the raw data of TEM images, that cover a significant part of the process variation range, to learn the process correlations between the structure parameters (geometry and material compositions). These process correlations may be then used to develop/optimize an OCD data interpretation model, which incorporates these process correlations as constraints in its parameterization. This allows/facilitates to obtain more accurate OCD metrology by reducing effects of metrology correlations, and by ensuring that the OCD model represents the real process.

The present invention provides for utilizing the above described TEM data interpretation to automatically obtain parameter values from TEM data and use these parameters for optimizing measurements (e.g. measured data interpretation) of other type, i.e. measurements based on different physical principles. An example of such other type measurements is OCD metrology. The present invention provides for efficient OCD solution development (model-based and modeless).

Examples of how the technique of the invention (full TEM data interpretation) can contribute to the OCD metrology include: automatically obtaining parameter values from TEM and using them for defense system (flagging situations where running OCD solution fails); automatically obtaining parameter values from TEM and using them for updating a modeless OCD solution; deriving improved OCD models using the raw TEM images; using the raw TEM images to identify in-line failures of OCD solution.

Combination of the TEM and OCD data (where the OCD data can be optimized using the TEM data as described above) can be used for further optimization of a 3D model of the structure to extract geometrical parameters of the structure.

Also, the present invention provides for strict and global fit co-optimization of the TEM image data (one or more images) with OCD spectral data (one or more spectra). To this end, a full set of images from Lamellae or only sub-set of images from Lamellae or single image from Lamellae can be used for the co-optimization. Similarly, a full set of available OCD spectra (with different measurement conditions, e.g. different inclination/azimuth and polarizations) or sub-set of available OCD spectra (for example, normal channel TE and TM polarizations) or single OCD spectrum can be used for optimization.

The strict co-optimization may utilize target function (merit function) which is an average of "local" merit functions from different sites (or some weighted average of the merit functions from different sites). The relevant structure parameters are kept (fixed) to be the same during optimization. In order to improve convergence, the co-optimization can be done at two steps: at first step optimization procedure is performed with regard to measurements on all sites independently, and at the second step the initial value of parameter(s) that is/are common for all the cites is obtained as average of the optimization results from the first step. Then, all images are co-optimized simultaneously by keeping the common parameters to have the same value.

Similarly, global co-optimization may use a target function which is average of target functions from different sites (or weighted average of such target functions from different sites), and the relevant parameters are kept to be the same during optimization. However, the "common" values may slightly vary from site to site and from patterned region to pattern region (e.g. die to die in a semiconductor wafer). In order to take into account such variation, the "common" parameters are kept independent for each measurement site, but a penalty function is added on variation of the "common" parameters. The penalty function is based on at least one selected global parameter (behavior of global parameter) characterizing at least one property of the structure; this may be expected physical behavior or expected process non-uniformity. The principles of penalty function based data interpretation are described in US 2013/124141, assigned to the assignee of the present application, and is incorporated herein by reference with respect to this specific example.

For example, considering a Chemical Mechanical Planarization (CMP) process, the "bowl" behavior across the wafer is typical for CMP-related parameters. For such parameter at each step, the best fit parabola is calculated (using parameter values and measurement sites positions on the wafer):

$$V_{IDEAL} = a*r^2 + b$$

Here, r is the wafer radius wafer and V is the parameter, which is distributed according to a parabolic function along the wafer radius r.

Thereafter, the penalty function is calculated as variation from the best fit parabolic behavior with some tolerance σ of the process non-uniformity:

$$\delta = \alpha \frac{1}{N} \sum \left( \frac{V - V_{IDEAL}(r)}{\sigma} \right)^2$$

In order to improve the convergence, the co-optimization can be done in two steps, as described above, i.e., at the first step all sites are optimized independently, and at the second step the penalty function is added. Then, all these images are co-optimized simultaneously by using the penalty function on variation across the "common" parameters.

The following are some examples of the advantageous use of the technique of the invention, i.e. the full TEM data interpretation using a 3D model of a structure.

One example is to use the TEM data obtained from one site for interpreting TEM image of another site. In other words, parameters determined from TEM data of one site are injected to optimize TEM measurements on the other site. This may include injection of some values from another TEM-measured site on the same wafer (e.g. from the same die or another die on the wafer), another structure at the same die or another die on the wafer, the same structure at different Lamellae orientation, the same structure at different Lamellae position, the same structure at different Lamellae thickness. Alternatively, this may be "range" injection of some values from another TEM site on the same wafer (from the same die or another die on the wafer). Due to possible variations between different dies/sites of the wafer, the value is injected but still remains open for optimization. The range for this value is narrowed and centered around injected value. Similarly, the injection may be performed for another structure at the same die or another die on the wafer, the same structure at different Lamellae orientation, the same structure at different Lamellae position, the same structure at different Lamellae thickness.

Another possible examples of using the technique of the invention is strict co-optimization of different TEM sites, i.e. TEM images from different sites (from the same die or another die on the wafer), e.g. another structure at the same die or another die on the wafer, the same structure at different Lamellae orientation, the same structure at different Lamellae position, the same structure at different Lamellae thickness. As described above, the co-optimization may use the target function being an average (or weighted average) of local target functions from different sites, and the relevant parameters are kept to be the same during optimization. In order to improve the convergence, the co-optimization can be done at two steps: all sites are optimized independently, then the initial value of common parameters is obtained as average of results from the independent optimization; and all images are co-optimized simultaneously by keeping common parameters to have the same value.

Yet another example is global fit co-optimization of different TEM sites, i.e. TEM images from different sites (from the same die or another die on the wafer). As described above, this may be another structure at the same die or another die on the wafer, the same structure at different Lamellae orientation, the same structure at different Lamellae position, the same structure at different Lamellae thickness. As described above, the co-optimization may use target function which is average (or weighted average) of target functions from different sites, and in order to take into account possible (slight) variation of the "common" values from site to site and from die to die, the "common" parameters are kept independent for each site, and the penalty function (based on expected physical behavior or expected process non-uniformity) is added on variation of the "common" parameters. This is exemplified above with respect to the CMP-related parameters. As also described above, the convergence can be improved by the two-step optimization process: (1) all sites are optimized independently, (2) the penalty function is added, and all images are co-optimized simultaneously by using penalty function on variation across "common" parameters.

Yet further example is the use of output parameters of a combined model to calibrate a TEM tool. Let us consider a photo-lithography process which is proved to be extremely accurate (to the level of ppm's) concerning periodicity and period of the patterned structures. In case of Double patterning, the process is accurate for Double-Pitch and in the case of Quadro-Patterning it is accurate for Quadro-Pitch. Pixel Size x can be optimized during a fitting procedure. Comparison of the pixel size x values obtained from optimization and from the settings of the TEM measurement mode can provide feedback on the accuracy of TEM settings.

The TEM tool effects can be taken into account in the combined model. More specifically, Gain and Offset calibration curves of the electronics of the tool can be incorporated in TEM data simulation in order to produce exactly the TEM simulated image at exactly the same measurement conditions as the measured one. This is especially important for non-linear effect, such as saturation which can be easily incorporated in a simulation engine/module.

The present invention also provides for the process control (process defense). To this end, the quality of the fitting/matching procedure (appropriately minimized merit function) can be used to automatically identify the process faults/defects (mismatch from the 3D model of the structure).

The structure parameters that can be determined from the full interpretation of the measured TEM images include any combination of the following: geometrical parameters of the structure, for example CD, STI_HEIGHT, etc.; material characteristics, for example scattering efficiency of Silicon or Silicon Oxide layers typically used in semiconductor wafers; Lamellae parameters, for example, Lamellae thickness and positions used in the TEM imaging/measurement; as well as acquisition parameters, for example gain and offset of amplifier used for STEM imaging, or pixel size of STEM or TEM image.

The quality of analysis of the measured TEM images is defined by the quality of the fitting/matching procedure and reliability of extracted parameters. The quality of fit is defined by the target function (merit function) value. If for example, the target function defined as average deviation, then lower values of the target function represent better quality of analysis and higher reliability of extracted parameter values. Also, the quality of fit may be defined by goodness of fit (GOF) value. This can be calculated as Normalized Crossed Correlation (NCC) between simulated and measured images. In this case, the higher values of GOF represents better quality of analysis and higher reliability of extracted parameter values. The quality of fit may be defined by Miss-Fit Bias (MFB) value which represents the surface of miss-fit adjusted areas with the same sign of deviation of simulated from measured image. In this case, the larger values of MFB represent larger systematic bias between the modeled and actual structure, and means lower reliability of extracted values. It should be noted that MFB indicates the limitation of the model from the real process. In other words, it indicates high probability of process faults or defects.

The 3D model of the structure (geometry and materials) is designed and optimized in order to cover a normal process window of the manufacturing process and most common miss-process failures (or deviations from the normal process. The process control (process defense) is a multi-level procedure.

First level includes extraction of the parameters' values, from each Lamellae image, based on the analysis of the TEM images. Also, the quality of analysis is calculated. This quality of analysis may have different metrics. For example, if TEM measurements includes 7 TEM images at different parts of Lamellae, each image can be analyzed, and set of parameters is extracted from each image. This includes one or more of the following:

Lamellae average control: The parameters can be averaged, and the resulting values are compared with a normal process window range. If one of the parameters goes beyond the normal process window range, an alarm is fired.

Strict control: If one of the parameters for one of the images (e.g. without averaging) goes beyond the normal process window range, an alarm is fired.

Within Lamellae variation control: The variation range within Lamellae for each parameter can be calculated. It can be done by either using a difference between the maximal and minimal values, or by using 3-StDev value. If the variation range for one of the parameters goes beyond the normal process window range, an alarm is fired.

Target function average control: If the averaged value of the target function from all TEM images becomes larger than a predefined threshold, an alarm is fired. The threshold for target function value can be obtained by investigating the target function values for the normal process window.

Target function strict control: If value of the target function from one of the images becomes larger than a predefined threshold, an alarm is fired.

GOF average control: If the averaged value of GOF from all the images becomes smaller than a predefined threshold, an alarm is fired. The threshold for GOF value can be obtained by investigating the GOF values for the normal process window.

GOF strict control: If value of GOF from one of the images becomes smaller than a predefined threshold, an alarm is fired.

MFB average control: If the averaged value of MFB from all the images becomes larger than a predefined threshold, an alarm is fired. The threshold for MFB value can be obtained by investigating the MFB values for the normal process window.

MFB strict control: If the value of MFB from one of the images becomes larger than a predefined threshold, an alarm is fired.

At the second level, the values of parameters are extracted by using simultaneous analysis of a full set or sub-set of TEM images in Lamellae. For example, if Lamellae has 11 images, all 11 images can be used. Alternatively, only some of the images (e.g. 6 images from 11) can be used. The reason to disregard other images may, for example, be associated with low quality of the measured images. This procedure includes one or more of the following:

Parameters control: The parameters values are compared with the normal process window range. If one of the parameters goes beyond the normal process window range, alarm is fired.

The target function control: If target function of simultaneous optimization becomes larger than a predefined threshold, an alarm is fired. As described above, the threshold for the target function value can be obtained by investigating the target function values for the normal process window.

GOF control: If GOF of simultaneous optimization becomes smaller than a predefined threshold (e.g. determined by investigating the GOF values for the normal process window), an alarm is fired.

MFB control: If MFB of simultaneous optimization becomes larger than a predefined threshold (e.g. obtained by investigating the MFB values for the normal process window), an alarm is fired.

A combined model can be used to calibrate out TEM tool effects.

Turning back to FIG. 1, the TEM images analysis according to the technique of the invention can be used for optimizing measurements of a different type, e.g. optical measurements (e.g. OCD measurements). In FIG. 1, model-based measurements of the different type are exemplified, where TEM data is used by modeling utility 22 and fitting module 24 to optimize the data interpretation model and find the best fit condition with different type measured data, e.g. OCD data. Alternatively, or additionally, such different type measurements may be model-based X-ray Scatterometry (XRS) and/or model-based X-ray fluorescence (XRF). In other words, structure parameters determined from the TEM images analysis can be used for optimizing measured data interpretation model(s) for XRS and/or XRF measurements.

Also, the above-described automatic robust and accurate retrieval of geometric and/or material parameters of 3D structures from one or several TEM/STEM images for the purpose of Optical Proximity Correction (OPC) modeling, for semiconductor process development, for calibrating a process simulator.

The invention claimed is:

1. A control system for use in measuring one or more parameters of a three-dimensional patterned structure, the control system being configured as a computer system comprising a data processor configured to receive and process raw measured TEM image data, $TEM_{meas}$, and generate output data indicative of one or more parameters of a patterned structure, wherein said data processor comprises:
    an optimization module configured and operable to utilize data indicative of one or more parameters of TEM measurement mode and perform a fitting procedure between the raw measured TEM image data, $TEM_{meas}$, and a predetermined simulated TEM image data, $TEM_{simul}$ based on a parametrized three-dimensional model of features of the patterned structure, and generate simulated image data corresponding to a best fit condition to thereby enable determination therefrom of the one or more parameters of the structure.

2. A control system according to claim 1, wherein said data processor further comprises a data simulator module, which is configured and operable to analyze data indicative of the parametrized three-dimensional model of features of the patterned structure, and create said predetermined simulated TEM image data, $TEM_{simul}$.

3. A control system according to claim 2, wherein the simulator module is configured and operable to generate the simulated TEM image data for multiple different Lamellae position and geometry with respect to the three-dimensional model of the patterned structure.

4. A control system according to claim 1, wherein said data indicative of the three-dimensional model comprises geometrical features including dimensions of the features of the structure.

5. A control system according to claim 1, wherein said data indicative of the three-dimensional model of the patterned structure comprises material related data of the structure.

6. A control system according to claim 1, wherein said one or more parameters of the structure to be determined comprise dimensional parameters, comprising one or more of the following: Critical Dimensions (CD) of the pattern features, thickness of one or more layers in the structure, Side Wall Angle (SWA).

7. A control system according to claim 1, wherein said data indicative of the one or more parameters of the TEM measurement mode comprises Lamellae geometry data.

8. A control system according to claim 7, wherein said Lamellae geometry data comprises at least one of the following: Lamellae thickness, Lamellae orientation, Lamellae position with respect to the structure.

9. A control system according to claim 8, wherein said data indicative of the one or more parameters of the TEM measurement mode further comprises data about a detection scheme corresponding to the measured TEM image data.

10. A control system according to claim 1, wherein said optimization module is configured and operable to perform said fitting procedure while varying one or more of the following: one or more of the three-dimensional model parameters; one or more of material properties; and Lamellae position with respect to the three-dimensional model of the structure.

11. A control system according to claim 1, further comprising a parameter calculator module configured and operable to provide, from the simulated TEM image data corresponding to the best fit condition, the one or more parameters of the patterned structure being measured.

12. A control system according to claim 11, further comprising an analyzer, in data communication with the parameter calculator module, the analyzer being configured to use the one or more parameters of the patterned structure determined from the TEM image data to optimize measured data corresponding to measurements of a type different from TEM, obtained on the patterned structure.

13. A control system according to claim 12, wherein said analyzer comprises a modelling utility configured and operable to use the one or more parameters of the patterned structure determined from the TEM image data and optimize measured data interpretation model for said measurements of the type different from TEM.

14. A control system for use in measuring one or more parameters of a three-dimensional patterned structure, the control system being configured as a computer system comprising a data processor configured to receive and process raw measured TEM image data, $TEM_{meas}$, and generate output data indicative of one or more parameters of a patterned structure, wherein said data processor comprises:
    a data simulator module, which is configured and operable to utilize data indicative of a three-dimensional model of the patterned structure and data indicative of one or more parameters of TEM measurement mode and generate simulated TEM image data, $TEM_{simul}$; and
    an optimization module configured and operable to perform a fitting procedure between the raw measured TEM image data, $TEM_{meas}$, and the simulated TEM image data, $TEM_{simul}$, and generate simulated image data corresponding to a best fit condition to thereby enable determination therefrom of the one or more parameters of the structure.

* * * * *